(12) United States Patent
Oliaei et al.

(10) Patent No.: US 6,999,014 B2
(45) Date of Patent: Feb. 14, 2006

(54) INCREMENTAL-DELTA ANALOGUE-TO-DIGITAL CONVERSION

(75) Inventors: Omid Oliaei, Schaumburg, IL (US); Berengere Le Men, Tournefeuille (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/494,316

(22) PCT Filed: Oct. 23, 2002

(86) PCT No.: PCT/EP02/11845

§ 371 (c)(1), (2), (4) Date: Apr. 30, 2004

(87) PCT Pub. No.: WO03/039006

PCT Pub. Date: May 8, 2003

(65) Prior Publication Data

US 2004/0263370 A1    Dec. 30, 2004

(30) Foreign Application Priority Data

Oct. 31, 2001    (EP) .................................. 01402821

(51) Int. Cl.
*H03M 3/00*    (2006.01)
(52) U.S. Cl. ...................................... 341/143; 341/138
(58) Field of Classification Search ................ 341/143, 341/155, 144, 138, 200

See application file for complete search history.

(56) References Cited

U.S. PATENT DOCUMENTS 5,144,308 A * 9/1992 Norsworthy ................ 341/131

5,550,544 A    8/1996 Sakiyama ................... 341/155

(Continued)

OTHER PUBLICATIONS

Gregorian et al., "A Continuosly Variable Slope Adaptive Delta Modulation Codec System," IEEE, pp. 692-700 (1983), no month.

(Continued)

*Primary Examiner*—Peguy JeanPierre

(57) ABSTRACT

A method of, and a converter for, converting an analogue input signal (X) to a digital output signal (Y) by incremental-delta conversion in which, at clock intervals, a non-uniform quantizer (7) produces digital quantizer signals, a digital-to-analogue converter (5) produces analogue quantizer signals that are a function of the digital quantizer signals, analogue difference signals (Q) are applied over a feedback loop to the quantizer (7) that are a function of the difference between the input signal (X) and the integral of the analogue quantizer signals since a reset signal, and the digital output signal (Y) is produced as a function of the sum of the digital quantizer signals since the reset signal. The digital quantizer signals have a first magnitude (q) if the magnitude of the analogue difference signals (Q) is less than a threshold magnitude ($V_t$) and a second magnitude (r), substantially greater than the first magnitude (q), if the magnitude (Q) of the analogue difference signals is greater than the threshold magnitude ($V_t$), the threshold magnitude ($V_t$) being substantially less than the magnitude ($V_r$) of the analogue quantizer signals corresponding to the second magnitude (r). The magnitude of the change in the analogue difference signals (Q) between two successive clock cycles is substantially less than the magnitude of the corresponding analogue quantizer signals ($V_q$, $V_r$), so that the gain (q) of the feedback loop from the digital-to-analogue converter (5) to the quantizer (7) is substantially less than one.

11 Claims, 5 Drawing Sheets

U.S. PATENT DOCUMENTS 6,184,812 B1 * 2/2001 Younis et al. ............... 341/143
6,271,782 B1 * 8/2001 Steensgaard-Madsen .... 341/143
6,525,682 B1 * 2/2003 Yap et al. .................... 341/137
6,556,158 B1 * 4/2003 Steensgaard-Madsen .... 341/131
6,734,818 B1 * 5/2004 Galton ....................... 341/161

OTHER PUBLICATIONS

Yufera et al., "$S^2I$ First-Order Incremental A/D Converter," IEEE Proc.-Circuits Devices Syst., vol. 145, No. 2, Apr. 1998, pp. 78-84.

* cited by examiner

−PRIOR ART−

−PRIOR ART−

INCREMENTAL-DELTA ANALOGUE-TO-DIGITAL CONVERSION

This application is a 371 of PCT/EP02/11845.

1. Field of the Invention

This invention relates to a method of and apparatus for analogue-to-digital conversion and more particularly to incremental-delta analogue-to-digital conversion.

2. Background of the Invention

Analogue-to-digital converters used for measurement applications are different from the modulators used in telecommunications in the sense that they are reset at the beginning of each conversion process, whereas modulators adjust continuously to variations in the analogue input signal, without reset.

Many different types of analogue-to-digital converters are known, among them delta converters and sigma-delta converters. Sigma-delta analogue-to-digital converters used for measurement applications have proven their capability of reaching high resolutions. However, the conversion time in an incremental sigma-delta is very long because a resolution of N bits requires $2^N$ clocks. So, incremental sigma-delta converters can be used only in very low-speed applications.

In the field of modulators, delta modulation has been generally used to encode voice signals over a few bits; the delta modulator may include a non-uniform quantizer. Delta converters have not found popularity for measurement applications in the past.

A basic delta modulator is shown in FIG. 1 and a basic sigma-delta modulator is shown in FIG. 2. Although the functions of the basic circuit elements are shown separately for the sake of illustration, it will be appreciated that in practice certain elements employed may in fact be common to more than one of the different functions of the modulator.

The delta modulator shown in FIG. 1 receives a variable (typically alternating) input signal X from a source 1. The input signal X is applied to a subtractor 2 in the modulator, which also receives a feedback signal F, whose amplitude is subtracted from the sampled amplitude of the input signal X at each clock period. The output signal from the subtractor 2 is applied to a quantizer 3 whose output signal Q is a binary signal representing the sign (positive or negative) of the subtractor output signal. The quantizer output signal Q is applied to an output circuit 4 that comprises a decimator, that is to say a low pass filter and down-sampler to produce an output signal Y. The quantizer output signal Q is also applied to a digital-to-analogue converter 5 that produces a signal whose amplitude represents the quantizer output signal Q and is applied to an integrator 6 that integrates the output signal of the digital-to-analogue converter over a finite period of time to produce the feedback signal F. Accordingly, the output signal of the subtractor corresponds to the difference between the input signal X and the feedback signal from the integrator 6.

The basic sigma-delta modulator shown in FIG. 2 comprises elements similar to the delta modulator of FIG. 1, which are designated by similar references. The sigma-delta modulator comprises a subtractor 2 that receives an input signal X from a source 1 and also receives a feedback signal F, whose amplitude is subtracted from the sampled amplitude of the input signal X at each clock period. The output signal from the subtractor 2 is applied to an integrator 6 that integrates the output signal of the subtractor 2 over a finite period of time to produce a signal that is applied to a quantizer 3. The output signal Q of the quantizer 3 is a binary signal representing the sign (positive or negative) of the subtractor output signal. The quantizer output signal Q is applied to an output circuit 4 that comprises a decimator, that is to say a low pass filter and down-sampler to produce an output signal Y. The quantizer output signal Q is also applied to a digital-to-analogue converter 5 that produces the feedback signal F, whose amplitude represents the quantizer output signal Q. Accordingly, the output signal of the subtractor corresponds to the difference between the input signal X and the feedback signal from the digital-to-analogue converter 5.

It will be seen that the delta modulator includes the analogue integrator 6 in the feedback path while in a sigma-delta modulator the analogue integrator 6 is in the feed-forward path.

The article by R. Gregorian and J. G. Gord," A Continuously Variable Slope Modulation Codec System", IEEE JSSC, vol. SC-18, No. 6, pp. 692–700, December 1983 proposes to improve the response of a delta modulator by using a non-uniform quantizer, the amplitude of whose output signal has a larger value for a large signal applied to its input and a smaller value for a small signal applied to its input. In this way, the delta modulator can respond a large step size to a rapidly varying input signal but a smaller step size, corresponding to finer resolution, for a slowly varying input signal, reducing overload distortion and granularity noise.

The present invention relates to incremental delta analogue-to-digital conversion.

The basic circuit of an incremental delta converter differs from that of a delta modulator as shown in FIG. 1 in that the output circuit includes a digital accumulator (or up/down counter), the analogue integrator 6 and the digital accumulator both being reset at the beginning of the conversion cycle. The digital accumulator and the analogue integrator 6 respectively totalise the digital difference signals from the quantizer 3 since reset and integrate the corresponding analogue signals since reset.

SUMMARY OF THE INVENTION

The present invention provides a method of, and a converter for, converting an analogue input signal (X) to a digital output signal (Y) by incremental-delta conversion as described in the accompanying claims.

DETAILED DESCRIPTION OF THE PREFERRED EMBODIMENTS

Figure 1:
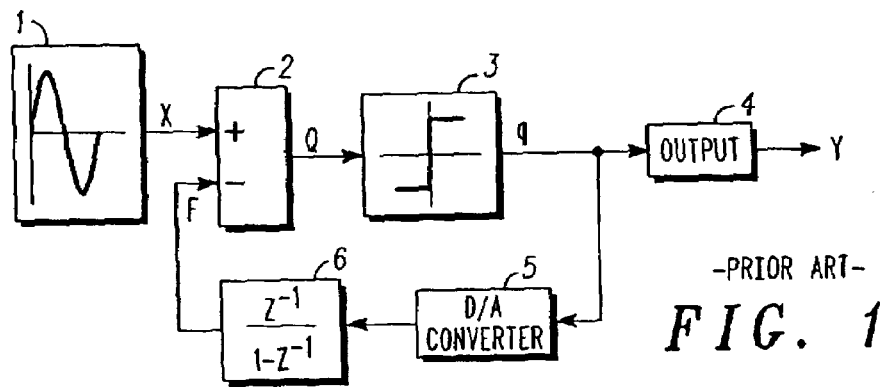
FIG. 1 is a schematic diagram of a delta modulator.
Figure 2:
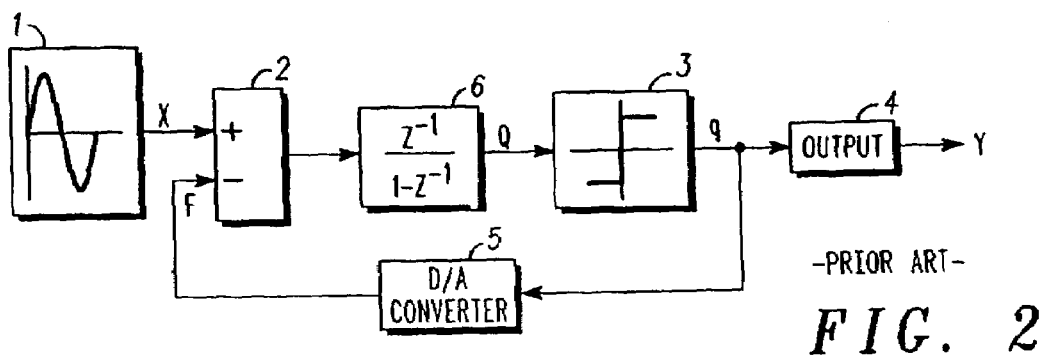
FIG. 2 is a schematic diagram of a sigma-delta modulator.
Figure 3:
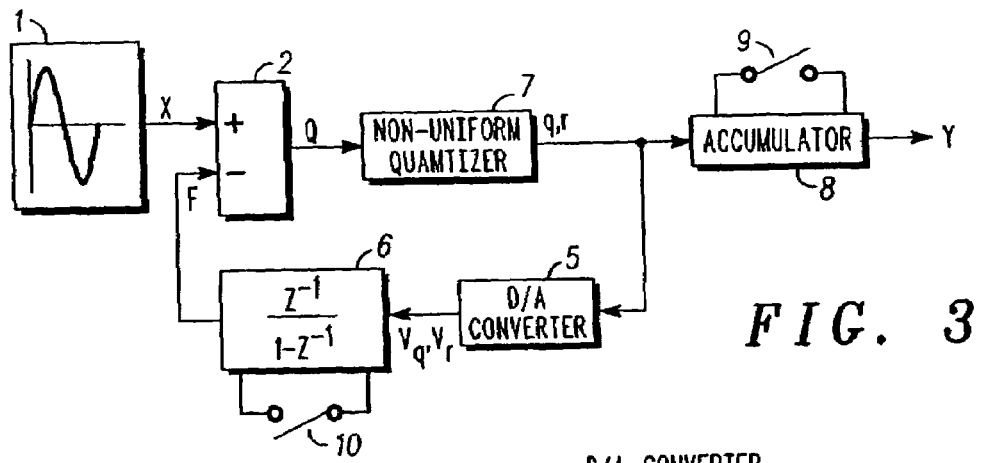
FIG. 3 is a schematic diagram of an incremental-delta analogue-to-digital converter in accordance with one embodiment of the invention.

FIG. 3 shows an incremental delta converter for measurement applications in accordance with one embodiment of the invention. In FIG. 3, similar elements to those shown in FIGS. 1 and 2 are designated by similar references.

The incremental delta converter shown in FIG. 3 comprises a source 1 of an input signal X that is sampled at the beginning of the measurement cycle and is therefore assumed to be substantially constant over the measurement cycle. The sampled input signal X is applied through a subtractor 2 that then receives a feedback signal F, whose amplitude is subtracted at each subsequent clock period from the amplitude of the input signal X. The output signal from the subtractor 2 is applied to a quantizer 7. The quantizer output signal Q is applied to an output circuit 8 that comprises an accumulator. The quantizer output signal Q is also applied to a digital-to-analogue converter 5 that produces a signal whose amplitude is proportional to the numerical value of the quantizer output signal Q and is applied to an integrator 6 that integrates the output signal of the digital-to-analogue converter to produce the feedback signal F. Reset means, shown symbolically as switches 9 and 10, reset the accumulator 8 and the integrator 6 at the beginning of the measurement cycle. Accordingly, the output signal of the subtractor corresponds to the difference between the initial value of the input signal X and the feedback signal F comprising the integral of the successive values of the analogue signals corresponding to the quantizer output signals integrated by the integrator 6.

In accordance with this embodiment of the invention, the quantizer 7 is a non-uniform quantizer, whose output signal takes one of four different numerical values ±q, ±r. The output signal is ±r if its input Q is greater than a threshold value $V_t$ (smaller than $-V_t$) and ±q if its input Q is smaller than $V_t$ (greater than $-V_t$), the output of the digital-to-analogue converter 5 taking one of four corresponding values $±V_q$ and $±V_r$, where r and $V_r$ are substantially greater than q and $V_q$. An advantage of such a non-uniform quantizer is to shorten the conversion time without penalising the precision of the measurement, since the conversion approaches the asymptotic value more rapidly, with large steps |r| and $|V_r|$, until the output of the integrator 6 is closer than $±V_t$ to the input signal X, and then continues its approach to the asymptotic value more slowly, with small steps |q| and $|V_q|$ offering high precision in the result. The input voltage range of the analogue-to-digital converter is limited to $±V_r$.

Figure 4:
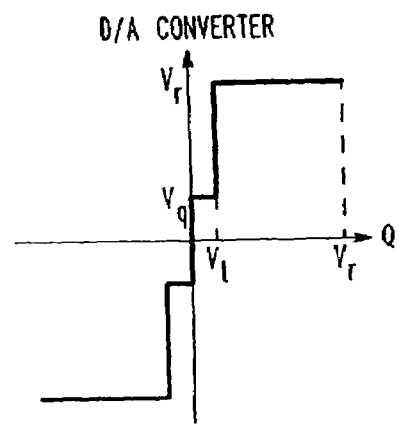
FIG. 4 is a graph of the input and output signals of a quantizer in the converter of FIG. 3.

FIG. 4 shows the characteristics of the quantizer 7, the horizontal axis representing the signal Q from the subtractor 2 and the vertical axis representing the value of the analogue signal at the output of the digital-to-analogue converter 5 corresponding to the output of the quantizer 7. At the beginning of the measurement cycle, the signal Q has a value equal to the input signal X and, if X is greater than $V_r$, the output of the quantizer takes the numeric value r and the output of the digital-to-analogue converter 5 takes the voltage $V_r$. At each subsequent clock period, the feedback signal F reduces the magnitude of the output Q of the subtractor 2 until it is less than $V_r$. When the magnitude of X is less than $V_r$, the output of the quantizer 7 takes the numeric value q, and the output of the digital-to-analogue converter 5 becomes $V_q$.

Figure 5:
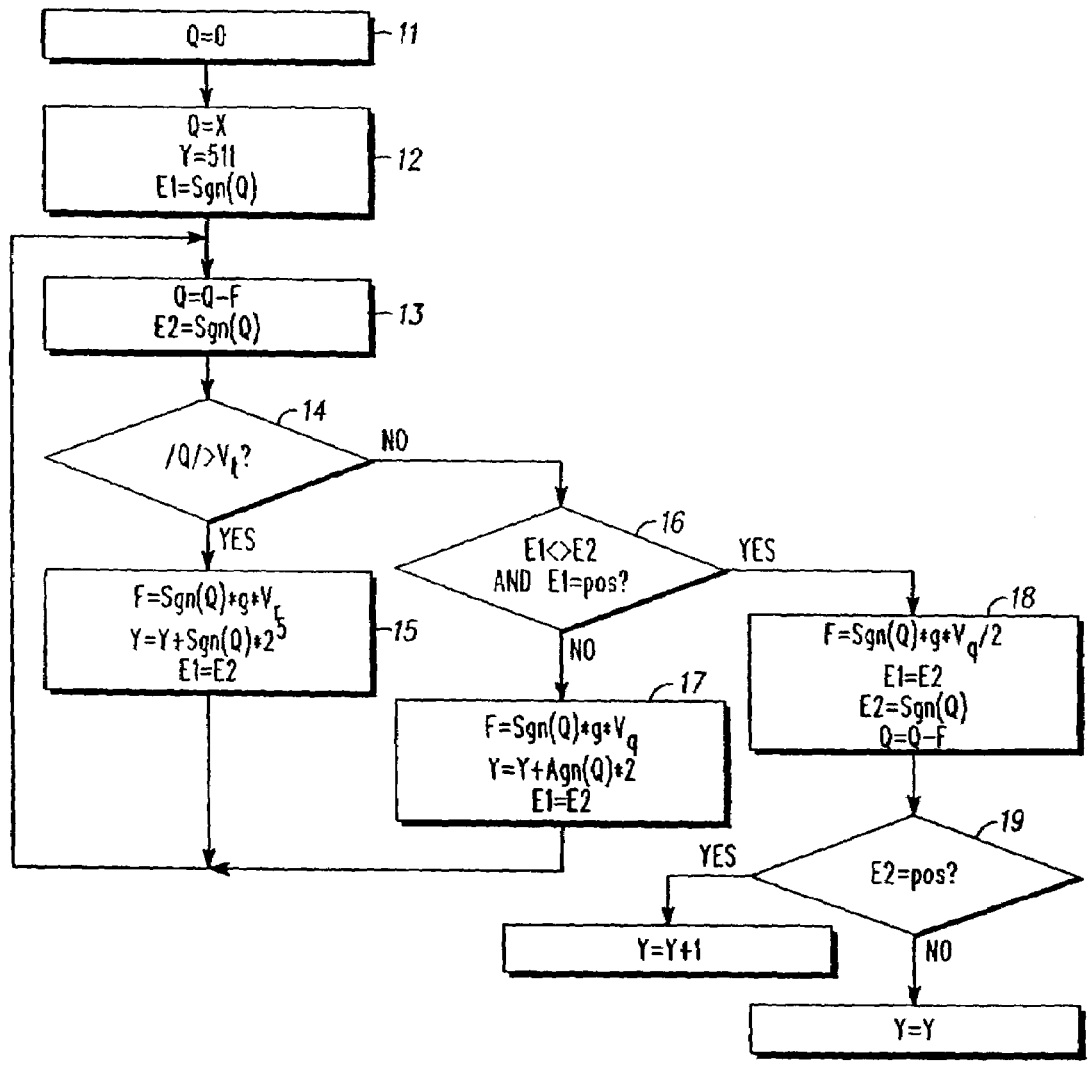
FIG. 5 is a flowchart of the operation of the converter of FIG. 3.

The method of operation is shown in FIG. 5 and begins with a reset stage 11 in which the integrator 6 and accumulator 8 are reset to zero so that the feedback signal F is zero and, before the input signal X is sampled, the output Q of the subtractor 2 is zero. In the next stage 12, the converter is initialised, the input signal X being sampled by the subtractor 2 so that the subtractor output Q is equal to X, the digital output Y is set to the maximum range of the accumulator 8, illustrated here for a 9-stage binary counter, so that Y equals 511, and an index E1 is set to indicate the sign (positive or negative) of the output signal Q of the subtractor 2. The initialisation step 12 may take several clock periods at the end of which the process enters the feedback loop.

In a first feedback stage 13, the output signal Q from the subtractor 2 is then set to its value in the preceding clock period minus the new feedback signal F and an index E2 is set to the new sign of the output signal Q. The following stage depends on a condition 14 whether the modulus of the output signal Q of the subtractor 2 is greater or not than the threshold value $V_r$. If so, in a stage 15, the feedback signal F is increased by the output $V_r$ of the digital-to-analogue converter 5 corresponding to a large step multiplied by the sign of the output signal Q of the subtractor 2 and multiplied by the gain g of the integrator feedback; the digital output signal Y is increased by the numerical value r ($=2^5$ in this example) corresponding to a large step multiplied by the sign of the output signal Q of the subtractor 2; the index E1 is set to the value of the index E2 and the operation returns to the feedback step 13.

If the condition 14 was negative, the modulus of the signal Q being less than $V_r$, the next stage depends on a condition 16 whether the index E1 is different from the index E2 and E1 is positive; if E1 is not different from E2, this implies that the analogue to digital converter is still converging towards the input signal X; in this case, at a stage 17, the feedback signal F and the output signal Y are adjusted by small steps respectively $V_q$ and q ($=2^1$ in this example) multiplied by the sign of the output signal Q. When the output of the analogue integrator 6 reaches and passes the initial amplitude of the input signal X, the output of the quantizer 7 changes sign and this is used to define the end of the conversion operation. This is signified by a positive response to the conditions 16 and the measurement cycle passes to a least significant bit ('LSB') stage 18. If at condition 16, E1 is positive although E2 is negative, this implies that X was positive and the process proceeds directly to LSB stage 18; if, however, E1 is negative although E2 is positive, this implies that X was negative and, to keep an identical LSB stage 18, the process passes first through the stage 18 again, to invert the sign of the signal Q.

At the LSB stage 18, the value of the feedback signal is increased by $V_q/2$ multiplied by the sign of the signal Q and multiplied by the gain of the integrator feedback, E1 is set to E2, E2 is set to the sign of the signal Q and the signal Q is set to its value in the preceding clock period less the value of the feedback signal F.

Extraction of the last significant bit (LSB) is only one extra clock period. In fact at the end of conversion, when the step size is changed to $V_q/2$, the following step depends on a condition 19 whether the index E2 is positive: if so, the count of the accumulator 8 is increased by one and if not it is left unchanged. The conversion cycle is then terminated.

It is assumed that the input voltage X is constant during the conversion process. The above description shows that the output signals can be written as:

$$y_d[N_{ck}] = N_t \cdot r + N_s \cdot q \quad (1)$$

$$y_a[N_{ck}] = N_t \cdot g \cdot V_r + N_s \cdot g \cdot V_q \quad (2)$$

$$V_r/V_q = r/q \quad (3)$$

where $N_{ck}$ represents the total number of steps or clocks in the current measurement cycle, $Y_d[N_{ck}]$ represents the value of the digital output signal Y after $N_{ck}$ steps, $N_l$ represents the number of large steps, $N_s$ the number of small steps, and the total number of steps or clocks $N_{ck}=N_l+N_s$ Obviously, the minimum step size represents the resolution of the ADC. So, for a resolution of N−1 bits we need:

$$g \cdot V_q = 2 \cdot LSB = \frac{2 \cdot V_r}{2^{N-1}} \quad (4)$$

In the present example, the voltage reference is provided by a band-gap reference voltage $V_r$=1.2V. The target resolution of the ADC is 10 bits over an input voltage range of 2.4V, so 1 LSB=2.34375 mV. The voltage is preferably generated by a resistor voltage-divider. The analogue integrator is preferably a switched-capacitor-integrator, whose gain is set by capacitor ratios. Two first parameters to be chosen in the analogue-to-digital converter are the voltage and the integrator gain g. Precautions are taken to ensure that, when the quantizer input passes the threshold voltage $V_t$, at the next clock the quantizer input will be in the region between $+V_t$ and $-V_t$. Otherwise, the quantizer input would oscillate around $+V_t$ and $-V_t$. This condition requires:

$$2 \cdot V_t > g \cdot V_r \quad (5)$$

The following values are used in the present example and are found to give a good compromise between accuracy, conversion time and power consumption:

$$g=1/16;\ V_q=V_r/16;\ V_t=V_r/24 \quad (7)$$

These values correspond to a resolution of 9 bits. The last bit of the ADC is obtained from the half valued step size $V_q/2$ used only at the last clock of the conversion cycle.

Figure 6:
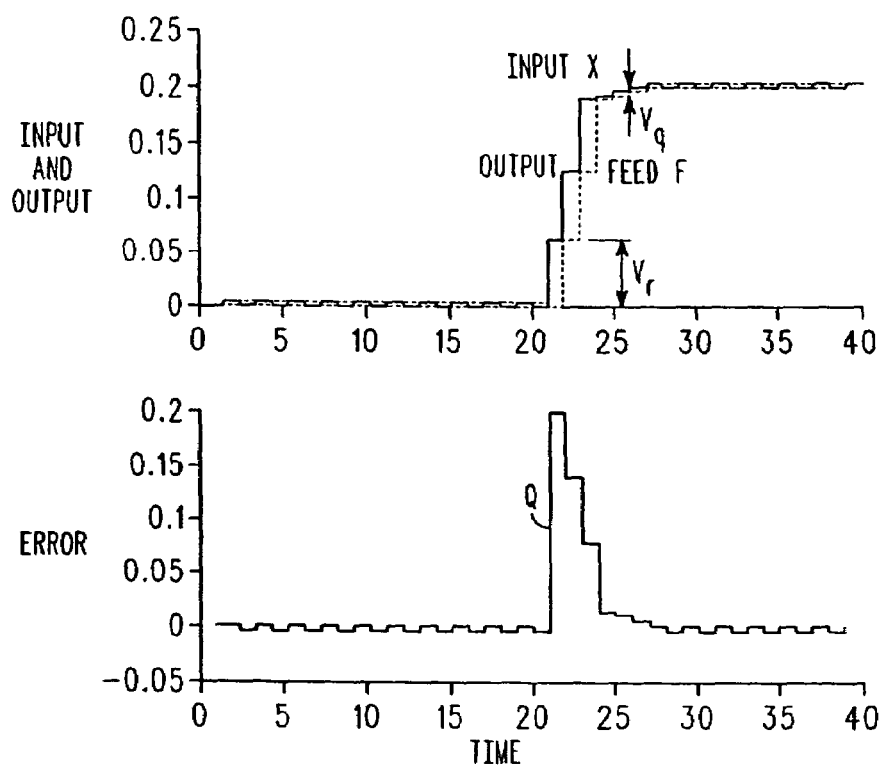
FIG. 6 is a graph of signals appearing in a simulation of the operation of the converter of FIG. 3.

Referring now to FIG. 6, the operation of the circuit of FIG. 3 according to the algorithm of FIG. 5 is illustrated by a simulation, in which the output signal Y is represented by a proportional voltage such that at full scale Y equals $V_r$. This simulation represents the operation with the end of measurement cycle operations 18 and 19 disabled. From clock periods zero to 19, the input signal X is zero and the output signal Y fluctuates between plus and minus $V_q$. In clock period 20, the input signal X is increased to +0.2 volts. In clock period 21, the output signal Y is increased by an amount corresponding to $V_r$. In clock period 22, the integrator 6 increases the feedback signal F by the same amount $V_r$ and the output Y from the accumulator 8 increases by a corresponding amount. The outputs F and Y of the integrator 6 and the accumulator 8 increase again by the same amount $V_r$ in clock period 23. In clock period 24, the output Q of the subtractor 2 becomes less than the threshold value $V_t$ and the output signal Y increases by the smaller amount $V_q$. The output signal Y and the feedback signal F continue to increase by small steps $V_q$ until clock period 28, when the sign of the signal Q from the subtractor 2 changes from positive to negative and the output signal Y decreases by $V_q$ instead of increasing. In this simulation, the output signal Y and feedback signal F subsequently oscillate about the value corresponding to the input signal X although, in practice, the measurement cycle would terminate in accordance with the algorithm shown in FIG. 5 with the operations 18 and 19.

Figure 7:
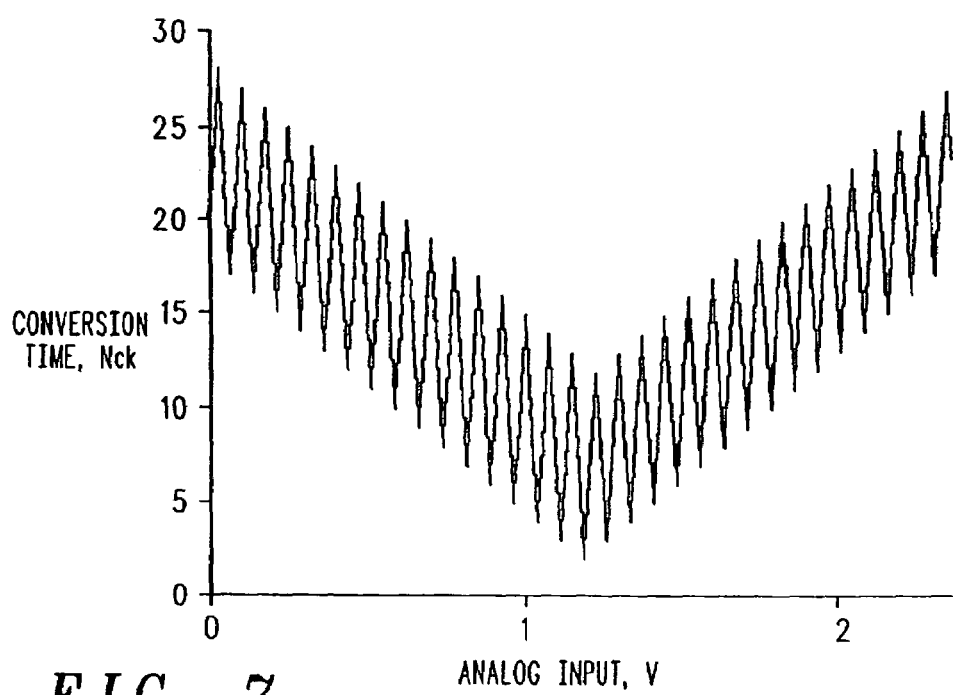
FIG. 7 is a graph showing the conversion time of the converter of FIG. 3 as a function of the input signal.

The number of clock cycles as a function of the input signal level for a complete conversion is plotted in FIG. 7. It is seen that the minimum required clock $N_{ck}|_{min}$=2, the maximum clock $N_{ck}|_{max}$=28 and the average clock $N_{ck}|_{ave}$=14.28.

This means that the circuit power consumption depends also on the input signal level. Accordingly, in the preferred embodiment, the circuit is switched off at the end of each conversion process, so that the average circuit power consumption is effectively divided by two. The digital blocks are completely turned off but the analogue blocks are not, to avoid causing any recovery problem.

Figure 8:
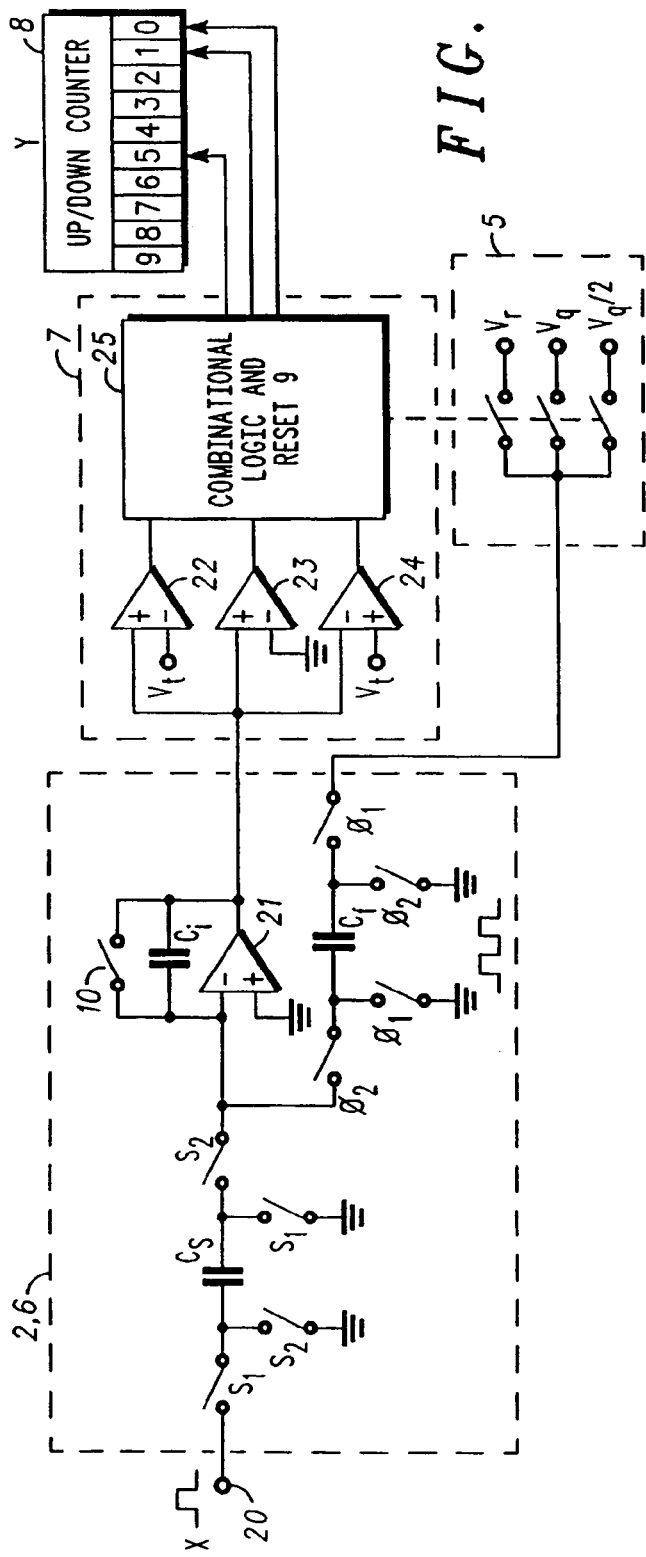
FIG. 8 is a simplified circuit diagram of an incremental-delta analogue-to-digital converter in accordance with a practical embodiment of the invention

FIG. 8 shows in more detail a practical embodiment of the basic analogue to digital converter shown in FIG. 3. In this embodiment, the input signal X is first sampled and the feedback signal F is subsequently subtracted from it in successive clock periods using a switched-capacitor circuit with a common amplifier that performs the sampling, integration and subtraction operations.

The input signal X is applied to a terminal 20 that is connected to the left plate of a sampling capacitor $C_s$ through a first initialising switch S1, the left plate of the capacitor $C_s$ being connected to ground through a first sampling switch S2. The right plate of the sampling capacitor $C_s$ is connected to ground through a second initialising switch S1 and to the negative input of an amplifier 21 through a second sampling switch S2, the positive input of the amplifier 21 being connected to ground. The output signal Q of the amplifier 21 is applied by a feedback loop to its negative input through an integrating capacitor $C_i$, in parallel with the reset switch 10. The output of the digital-to-analogue converter 5 is connected through a first integrating phase switch Ø1 to the right-hand plate of a feedback capacitor $C_f$, the right-hand plate of the capacitor $C_f$ also being connected to ground through a second integrating phase switch Ø2. The left-hand plate of the capacitor $C_f$ is connected to ground through another first integrating phase switch Ø1 and is connected to the negative terminal of the amplifier 21 through another second integrating phase switch Ø2.

The quantizer 7 comprises three comparators 22, 23 and 24 and a logic circuit 25. The positive input terminals of each of the comparators 22, 23 and the negative input terminal of the comparator 24 are connected to the output of the amplifier 21. The negative input terminal of the comparator 22 receives a voltage $V_t$, the negative input terminal of the comparator 23 is connected to ground and the positive input terminal of the comparator 24 receives a threshold voltage $-V_t$. The outputs of each of the comparators 22, 23 and 24 are connected to the logic circuit 25 that selects the digital value r, q or q/2 that is applied to increment the up down counter 8 with the appropriate positive or negative sign and also to select the corresponding output voltage $V_r$, $V_q$ or $V_q/2$ of the digital-to-analogue converter 5.

In operation, the measurement cycle begins with the reset stage 11, in which the first initialising switch S1 and the second sampling switch S2 are open, while the second initialising switch S1 and the first sampling switch S2 are closed so as to short-circuit the sampling capacitor $C_s$ to ground while it is isolated from the amplifier 21. The switch 10 is also closed to short-circuit the integrating capacitor $C_i$.

During the sampling phase 12, the initialising switches S1 are closed and the sampling switches S2 are opened during one or more initialising clock periods so as to charge the left-hand plate of the capacitor $C_s$ to the voltage of the signal X with its right-hand plate grounded. In one or more subsequent clock periods, the initialising switches S1 are opened and the sampling switches S2 are closed so as to connect the left-hand plate of the capacitors $C_s$ to ground and apply the voltage of the right-hand plate of the capacitor $C_s$ to the negative input terminal of the amplifier 21. During this time, the circuit operates as a switched-capacitor amplifier with unity gain, so that the integrating capacitor $C_i$ is charged to the voltage X. When the sampling is complete, the switches S1 and S2 are opened, to isolate the amplifier from the sampling capacitor $C_s$. The quantizer 7 registers the value of the output signal Q of the amplifier 21 relative to the threshold voltages plus and minus $V_t$ and relative to ground, as a function of the outputs of the comparators 22, 23 and 24.

In the next clock period, the values of the increment plus or minus r, q or q/2 are applied to the counter 8 and the corresponding values plus or minus $V_r$, $V_q$ or $V_q/2$ at the output of the digital-to-analogue converter 5 are selected and applied to the feedback loop.

During the feedback phases 13 to 19, the first feedback switches Ø1 are closed initially to charge the feedback capacitor $C_f$ to the selected output voltage from the selected digital-to-analogue converter side and during the next clock period, the switches Ø1 are opened and the feedback switches Ø2 are closed to transfer the charge of the feedback capacitor $C_f$ to the capacitor $C_i$ through the negative input of the amplifier 21.

The gain of the integrator is given by the ratio of the feedback and integrating capacitances: $g=C_f/C_i$. It has been found that a value of 60 dB for the gain A of the amplifier 21 is sufficient to keep error due to integrator leakage below 0.2 LSB and a gain of 75 dB reduces the error to 0.04 LSB; accordingly, the circuit is not sensitive to the gain A of the amplifier 21.

Figure 9:
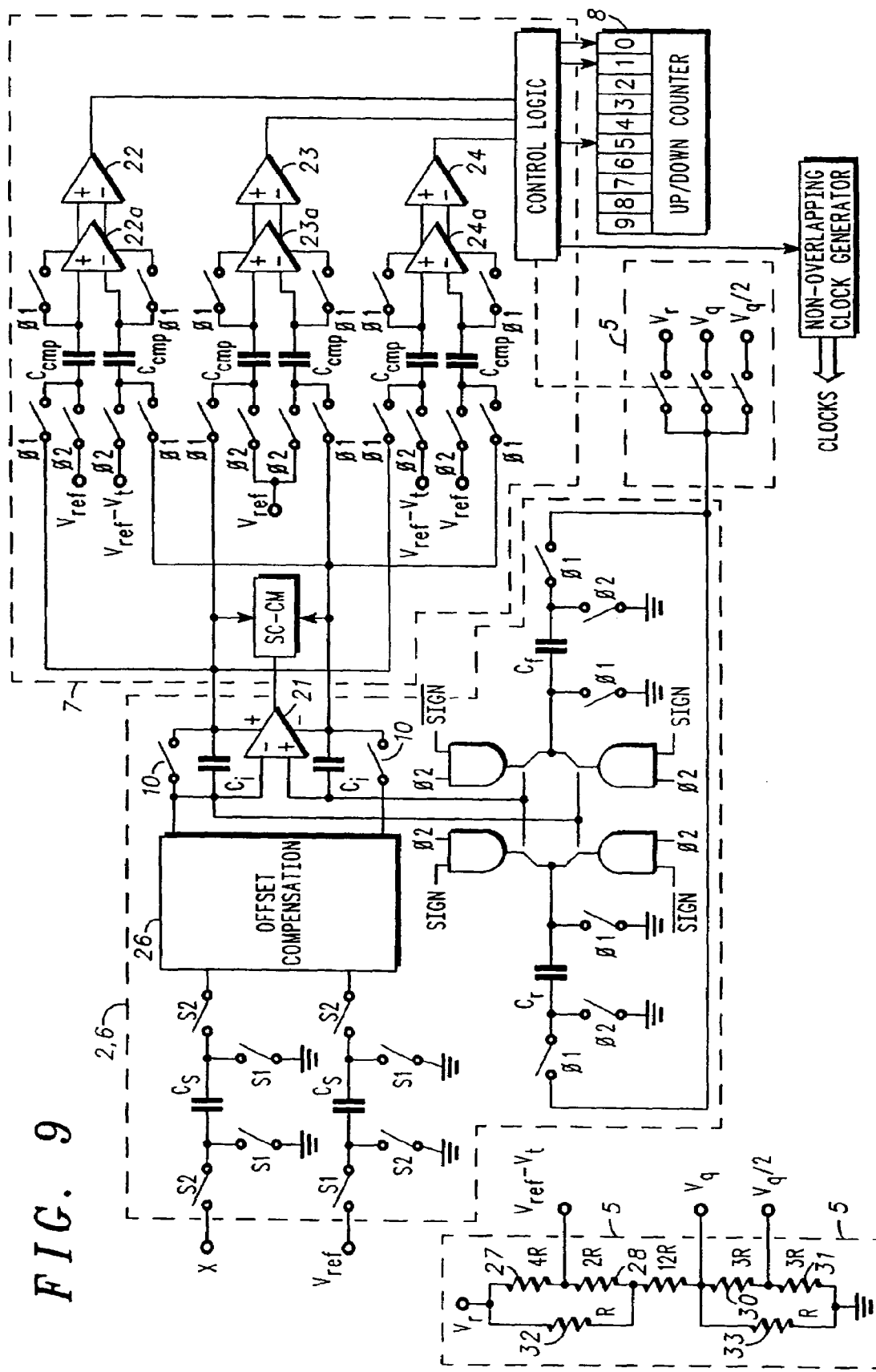
FIG. 9 is a more detailed circuit diagram of a preferred embodiment of the converter of FIG. 8.

Referring now to FIG. 9, in the preferred embodiment, suitable for implementation in an integrated circuit, the subtractor and integrator circuits 2 and 6 and the quantizer circuit 7 are full differential implementations, to reduce residual errors. In FIG. 9 similar references are used for similar components.

In the differential subtractor 2, the input signal X applied to the top half of the differential implementation is compared with a voltage $V_{ref}$ applied to the bottom half of the differential implementation. The control logic 25 produces a signal sign from the outputs of the comparators 22, 23 and 24 that indicates the sign of the output signal Q from the amplifier 21. The output of the digital-to-analogue converter 5 is applied to the positive or negative input to the amplifier 21 according to the value of the signal sign.

Figure 10:
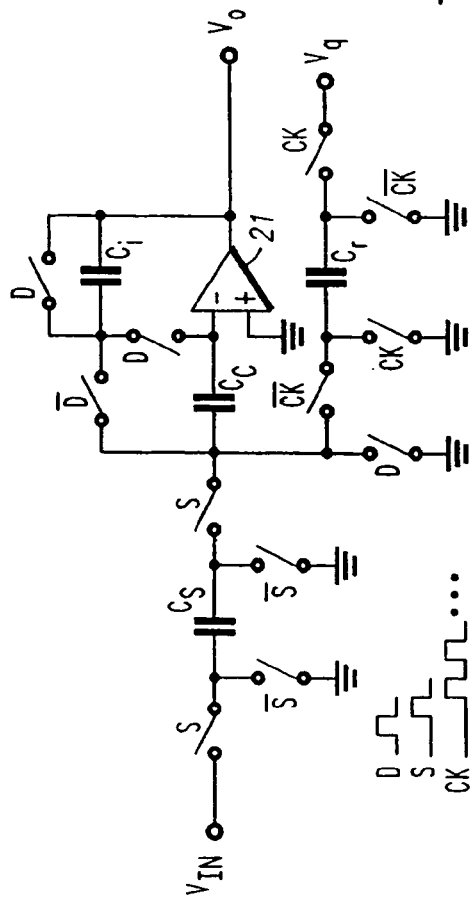
FIG. 10 is a simplified circuit diagram of an offset compensation circuit in the converter of FIG. 8.

In order to compensate amplifier offset voltage, an offset compensation circuit 26 is inserted between the switches S2 and the inputs of the amplifier 21. FIG. 10 shows an offset compensation circuit in single-sided form for the amplifier 21 of FIG. 8; its adaptation to a fully differential implementation as in FIG. 9 will be apparent to those skilled in the art. The offset compensation components include a capacitor $C_c$ inserted between the switch S2 and the negative input of the amplifier 21, a switch D connected between the left plate of the capacitor $C_c$ and ground, a switch D connected in series between the left plate of the capacitor $C_i$ and the negative input of the amplifier 21, and a switch D connected between the left plate of the capacitor $C_i$ and the left plate of the capacitor $C_c$. In operation, the amplifier offset is sampled once at the beginning of each conversion cycle at the end of the reset stage 11. During the clock phase D, the switches D are closed and so is the switch 10; the switch D is open; the integrating capacitor $C_i$ discharges and at the same time the compensation capacitor $C_c$ charges to the amplifier input offset voltage. During the subsequent sampling phases and feedback phases, the virtual ground of the circuit will be the left-hand plate of the capacitor $C_c$, so that the offset voltage is corrected by the voltage across the capacitor $C_c$.

Referring again to FIG. 9, each of the comparators 22, 23 and 24 includes a respective preamplifier 22a, 23a, 24a, performing the functions both of differential comparison and offset compensation for the comparators, and a respective capacitor $C_{cmp}$ connected in series with each input of each of the preamplifiers 22a, 23a and 24a. The positive input of the preamplifier of the comparator 22 is connected through the respective capacitor $C_{cmp}$ to the integrator positive output of the amplifier 21 through a switch Ø1 and to the reference voltage $V_{ref}$ through a switch Ø2. The negative input of the preamplifier is connected through the respective capacitor $C_{cmp}$ to the negative output of the integrator amplifier 21 through a switch Ø1 and to a voltage $V_{ref}$-$V_t$ through a switch Ø2. The comparator 24 is connected in the opposite way. The comparator 23 has its positive and negative inputs connected through the respective capacitors $C_{cmp}$ to the positive and negative outputs respectively of the integrator amplifier 21 through switches Ø1 and to the reference voltage $V_{ref}$ through switches Ø2. Each output of each of the preamplifiers 22a, 23a and 24a is connected to its corresponding input through a respective switch Ø1. In operation, during the clock phase Ø1 the preamplifier is configured as a voltage follower, so that the right plates of the capacitors $C_{cmp}$ inserted in series with the preamplifier inputs are charged initially to the preamplifier input offset and the left plates are connected to the integrator outputs. On clock phase Ø2, the left plates of the compensation capacitors $C_{cmp}$ are charged to the input voltages $V_{ref}$, or $V_{ref}$-$V_t$.

The digital-to-analogue converter 5 comprises a chain of unit resistors. The voltage $V_r$ is applied to the series connection of 4 unit resistors 27, 2 unit resistors 28, 12 unit resistors 29, 3 unit resistors 30 and 3 unit resistors 31. A single unit resistor 32 is connected in parallel with the series combination of the unit resistors 27 and 28 and a unit resistor 33 is connected in parallel with the series combination of the unit resistors 30 and 31. The voltage $V_{ref}$ minus $V_t$ is obtained from the junction between resistors 27 and 28. The voltage $V_q$ is obtained from the junction between resistors 29 and 30 and the voltage $V_q/2$ is obtained from the junction of resistors 30 and 31. Since only the voltages $V_q$ and $V_q/2$ are derived from the resistor string, the voltage $V_r$ being derived directly from a reference voltage, inaccuracies in the values of the unit resistors in the string only affect the values of 1*LSB and 2*LSB used in the integrator. The result accordingly has low sensitivity to the inaccuracies of the unit resistors.

The analogue-to-digital converter shown in the drawings represents a good trade-off between speed, accuracy and power consumption. Furthermore, special design techniques allows for a reduced sensitivity to analogue circuitry. The proposed architecture is especially useful for low-power medium-speed and medium-resolution applications. is faster than a sigma-delta converter. Compared with a cyclic converter, the converter shown in the drawings needs only one operational amplifier instead of two, and two large capacitors instead of seven; while it uses more comparators, they occupy relatively little semiconductor area and the clock generation is substantially simpler. The converter shown in the drawings has satisfactory accuracy.

The invention claimed is:

1. A method of converting an analogue input signal to a digital output signal by incremental-delta conversion in which, at clock intervals, a quantizer produces digital quantizer signals, a digital-to-analogue converter produces analogue quantizer signals that are a function of said digital quantizer signals, an integrator is responsive to integrator reset signals to produce integrator signals that are integrals with time of said analogue quantizer signals since said reset signals, a feedback loop applies to said quantizer analogue difference signals that are a function of a feedback loop gain and of a difference between said input signal and said integrator signals, and said digital output signal is produced as a function of a sum of said digital quantizer signals since said reset signal; wherein said quantizer is a non-uniform quantizer in which said digital quantizer signals have a first magnitude if said analogue difference signals present a magnitude smaller than a threshold magnitude and a second magnitude, substantially greater than said first magnitude, if the magnitude of said analogue difference signals is greater than said threshold magnitude, said threshold magnitude being substantially less than the magnitude of said analogue quantizer signals corresponding to said second magnitude, and said analogue difference signals changing between two successive clock cycles by a magnitude that is substantially less than the magnitude of the corresponding analogue quantizer signals, so that the gain of the feedback loop from said digital-to-analogue converter to said quantizer is substantially less than one.

2. A method as claimed in claim 1, wherein said threshold magnitude is greater than half the value of said feedback loop gain multiplied by the magnitude of said analogue quantizer signals corresponding to said second magnitude.

3. A method as claimed in claim 1, in which the conversion continues until the change of said analogue difference signals between two successive clock periods changes sign.

4. A method as claimed in claim 3, wherein at the end of the conversion, a least significant digit of said digital output signal is modified as a function of a residual magnitude of said quantizer digital signal.

5. An incremental-delta analogue-to-digital converter for converting an analogue input signal to a digital output signal comprising:
   clock means for defining clock intervals;
   quantizer means for producing digital quantizer signals at said clock intervals;
   digital-to-analogue converter means for producing analogue quantizer signals that are a function of said digital quantizer signals;
   reset means for producing a reset signal;
   integrator means responsive to said reset signal to produce an integrator signal that is an integral with time of said analogue quantizer signal since said reset signal;
   feedback means for applying analogue difference signals over a feedback loop to said quantizer means that are a function of a feedback loop gain and of a difference between said input signal and said integrator signal;
   and output means for producing said digital output signal as a function of a sum of said digital quantizer signals since said reset signal;
   wherein said quantizer means comprises non-uniform quantizer means such that said digital quantizer signals have a first magnitude if said analogue difference signals present a magnitude less than a threshold magnitude and a second magnitude, substantially greater than said first magnitude, if the magnitude of said analogue difference signals is greater than said threshold magnitude, the gain of the feedback loop from said digital-to-analogue converter to said quantizer being substantially less than one so that said analogue difference signals change between two successive clock cycles by a magnitude substantially less than the magnitude of the analogue quantizer signals.

6. An incremental-delta analogue-to-digital converter as claimed in claim 5, wherein said threshold magnitude is greater than half the value of said gain multiplied by the magnitude of said analogue quantizer signals corresponding to said second magnitude.

7. An incremental-delta analogue-to-digital converter as claimed in claim 5, in which the conversion continues until the change of said analogue difference signals between two successive clock periods changes sign.

8. An incremental-delta analogue-to-digital converter as claimed in claim 7, wherein at the end of the conversion, a least significant digit of said digital output signal is modified as a function of a residual magnitude of said quantizer digital signal.

9. An incremental-delta analogue-to-digital converter in claim 5, wherein said output means comprises a digital accumulator.

10. An incremental-delta analogue-to-digital convener in claim 5, wherein said feedback means and said quantizer means comprise switched-capacitor amplifiers with input voltage offset compensation.

11. An incremental-delta analogue-to-digital converter in claim 5, wherein said digital-to-analogue converter means comprises a resistor string supplied by said analogue signal corresponding to said second magnitude to define said threshold magnitude and said analogue signal corresponding to said first magnitude.

* * * * *